(12) United States Patent
Fukuda et al.

(10) Patent No.: US 7,812,518 B2
(45) Date of Patent: Oct. 12, 2010

(54) ORGANIC ELECTROLUMINESCENT DISPLAY APPARATUS

(75) Inventors: Koichi Fukuda, Tokyo (JP); Masataka Yashima, Tokyo (JP); Toshinori Hasegawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 359 days.

(21) Appl. No.: 11/691,717

(22) Filed: Mar. 27, 2007

(65) Prior Publication Data

US 2007/0236135 A1    Oct. 11, 2007

(30) Foreign Application Priority Data

Apr. 5, 2006    (JP)    ............... 2006-103937
Mar. 16, 2007   (JP)    ............... 2007-068822

(51) Int. Cl.
*H01L 51/54* (2006.01)
(52) U.S. Cl. ...................... 313/504; 313/506
(58) Field of Classification Search ......... 313/498–512; 315/169.1, 169.3; 429/690–691, 917; 438/26–29, 438/34, 82; 257/40, 72, 98–100, 642–643, 257/759; 427/58, 64, 66, 532–535, 539; 445/24–25; 428/690–691, 917
See application file for complete search history.

(56) References Cited

U.S. PATENT DOCUMENTS

| | | | | |
|---|---|---|---|---|
| 6,570,584 | B1 | 5/2003 | Cok | ........................... 345/690 |
| 6,909,233 | B2* | 6/2005 | Cok et al. | ................... 313/506 |
| 7,126,270 | B2* | 10/2006 | Fujii | ........................... 313/505 |
| 2005/0140278 | A1* | 6/2005 | Kato | ........................... 313/504 |
| 2005/0225232 | A1* | 10/2005 | Boroson et al. | ............. 313/504 |
| 2006/0006797 | A1 | 1/2006 | Ito | ............................... 313/506 |
| 2006/0261732 | A1* | 11/2006 | Miller et al. | ................. 313/504 |
| 2007/0048546 | A1* | 3/2007 | Ren | ............................ 428/690 |
| 2007/0048547 | A1* | 3/2007 | Chang et al. | ................. 428/690 |
| 2007/0231596 | A1* | 10/2007 | Spindler et al. | ............. 428/690 |
| 2007/0241669 | A1* | 10/2007 | Liu et al. | ..................... 313/504 |
| 2007/0257609 | A1 | 11/2007 | Fukuda et al. | .............. 313/506 |

FOREIGN PATENT DOCUMENTS

WO    WO 2004/036535    4/2004

OTHER PUBLICATIONS

Translation of JP 2005-156925, Jun. 2005.

\* cited by examiner

*Primary Examiner*—Nimeshkumar D Patel
*Assistant Examiner*—Donald L Raleigh
(74) *Attorney, Agent, or Firm*—Fitzpatrick, Cella, Harper & Scinto

(57) ABSTRACT

There is provided an organic electroluminescent display apparatus including a plurality of pixels constituting a display portion, each of the pixels includes sub-pixels of at least four colors, each of which includes an organic electroluminescent device having a pair of the electrodes and an organic compound layer formed between the pair of the electrodes, and the sub-pixels of at least four colors constitute a convex polygon containing a white color on CIE chromaticity coordinates, and includes the sub-pixels of two colors to be complementary colors with the white color interposed therebetween. In this case, the organic compound layers of the sub-pixels of two colors each contain a phosphorescent organic compound. The organic electroluminescent display apparatus can enlarge the color gamut and simultaneously can reduce the power consumption.

8 Claims, 5 Drawing Sheets

ORGANIC ELECTROLUMINESCENT DISPLAY APPARATUS

BACKGROUND OF THE INVENTION

1. Field of the Invention

The present invention relates to a display apparatus utilizing a light emitting device using an organic compound. More specifically, the present invention relates to a display apparatus using an organic electroluminescent (EL) device (OLED) which emits light by applying an electric field to a thin film made of an organic compound.

2. Description of the Related Art

In a color display as well as an organic EL display, it is an important element for displaying an image with fidelity that a color reproduction range is large. Generally, in a color display, color is reproduced using a combination of three sub-pixels of RGB that are three primary colors of light as one pixel, and each chromaticity of RGB determines a color reproduction range of the color display.

As a standard of measure of a color gamut representing a color reproduction range, for example, there is National Television System Committee (NTSC). According to the NTSC system, $R_{NTSC}$ (0.67, 0.33), $G_{NTSC}$ (0.21, 0.71), and $B_{NTSC}$ (0.14, 0.08) are adopted as a CIE chromaticity of the RGB three primary colors, and $W_{NTSC}$ (0.31, 0.316) is adopted as a CIE chromaticity of white color. As shown in FIG. 7, the area of a triangle surrounded by these three points is defined as a color gamut of 100% on CIE chromaticity coordinates.

As the conventional art of enlarging the color gamut of a display, U.S. Pat. No. 6,570,584, International Publication No. WO2004/036535, and U.S. Patent Application Publication No. 2006/0006797 propose introducing a plurality of sub-pixels having colors outside of the color gamut defined by RGB sub-pixels as well as the sub-pixels of three colors of RGB.

Certainly, the color gamut can be enlarged by the techniques of the above-mentioned patent documents. However, in a display, it is important to reduce power consumption, and particularly in a display mounted on portable electronic equipment and a portable television, low power consumption is demanded so as to keep the driving time by a battery long. In contrast, the techniques of the above-mentioned patent documents have a problem in that the decrease in power consumption is not considered.

SUMMARY OF THE INVENTION

In view of the above-mentioned problems, according to the present invention, the color gamut of an organic EL display apparatus is enlarged, and simultaneously, the power consumption is reduced.

That is, according to the present invention, there is provided an organic EL display apparatus, including a plurality of pixels constituting a display portion, in which: each of the pixels includes sub-pixels of at least four colors; each of the sub-pixels including an organic EL device having a pair of electrodes and an organic compound layer formed between the pair of the electrodes; the sub-pixels of at least four colors constitute a convex polygon containing a white color in a CIE chromaticity diagram; the sub-pixels of at least four colors each contain the sub-pixels of two colors to be complementary colors; and each of the organic compound layers of the sub-pixels of two colors contains a phosphorescent organic compound.

According to the present invention, the color gamut of an organic EL display apparatus can be enlarged, and simultaneously, the power consumption can be reduced.

Further features of the present invention will become apparent from the following description of exemplary embodiments with reference to the attached drawings.

DESCRIPTION OF THE EMBODIMENTS

Hereinafter, the present invention will be described with reference to FIGS. 1 and 2.

Figure 1:
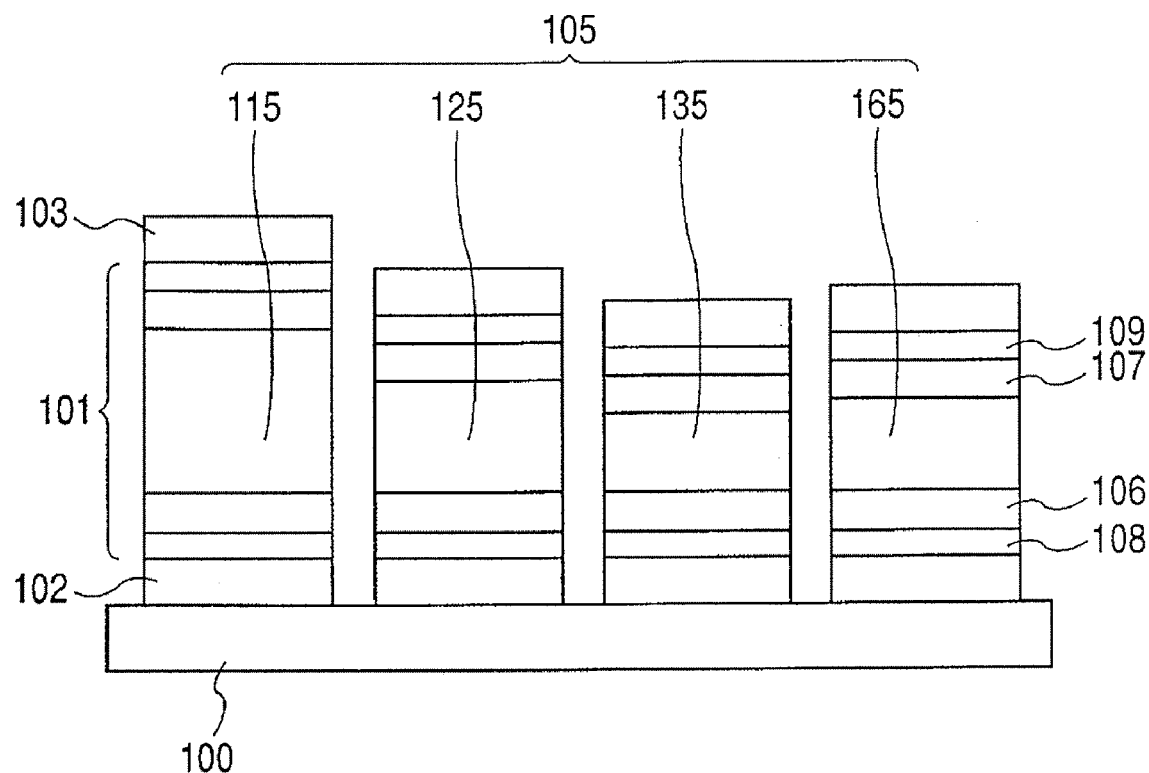
FIG. 1 is a schematic cross-sectional view showing an exemplary pixel configuration in an organic EL display apparatus of the present invention.
Figure 2:
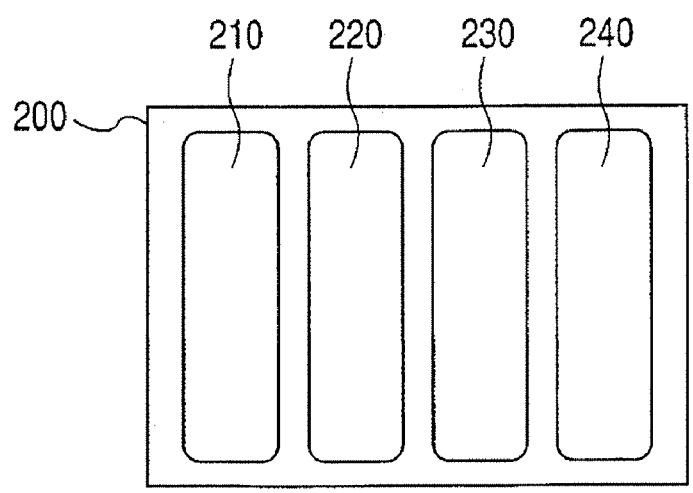
FIG. 2 is a schematic top view showing the exemplary pixel configuration in the organic EL display apparatus of the present invention.

FIGS. 1 and 2 are a schematic cross-sectional view and a schematic top view, respectively, showing an exemplary pixel configuration of an organic EL display apparatus of the present invention.

As shown in FIG. 2, one pixel 200 includes four sub-pixels: an R (red) sub-pixel 210, a G (green) sub-pixel 220, a B (blue) sub-pixel 230, and a C (cyan) sub-pixel 240. As shown in FIG. 1, an organic EL device constituting each sub-pixel has a configuration in which an organic layer 101 is sandwiched between a reflective electrode 102 that is an anode and a transparent electrode 103 that is a cathode on a substrate 100. The organic layer 101 usually has a configuration in which a hole transporting layer 106, a light emitting layer 105, and an electron transporting layer 107 are stacked successively. Further, if required, a hole injecting layer 108 may be interposed between the anode and the hole transporting layer, and an electron injecting layer 109 may be interposed between the cathode and the electron transporting layer. Regarding the R sub-pixel and the C sub-pixel, the light emitting layer 105 is formed of an R light emitting layer 115 and a C light emitting layer 165 containing a phosphorescent organic compound. On the other hand, regarding the G sub-pixel and the B sub-pixel, the light emitting layer 105 is formed of a G light emitting layer 125 and a B light emitting layer 135 containing a fluorescent organic compound.

In the present embodiment, the R sub-pixel and the C sub-pixel each include a phosphorescent organic EL device with a high light emitting efficiency larger than an internal quantum efficiency of 25%. On the other hand, the G sub-pixel and the B sub-pixel each include a fluorescent organic EL device with an internal quantum efficiency of 25% or less. Table 1 shows the chromaticity and light emitting efficiency of each RGBC sub-pixel in the present embodiment, and FIG. 3 shows a color gamut thereof.

TABLE 1

| SUB-PIXEL | CIEx | CIEy | LIGHT EMITTING EFFICIENCY [cd/A] |
|---|---|---|---|
| R | 0.651 | 0.349 | 21.6 |
| G | 0.260 | 0.658 | 19.8 |
| B | 0.137 | 0.110 | 2.3 |
| C | 0.123 | 0.250 | 16.4 |

Figure 3:
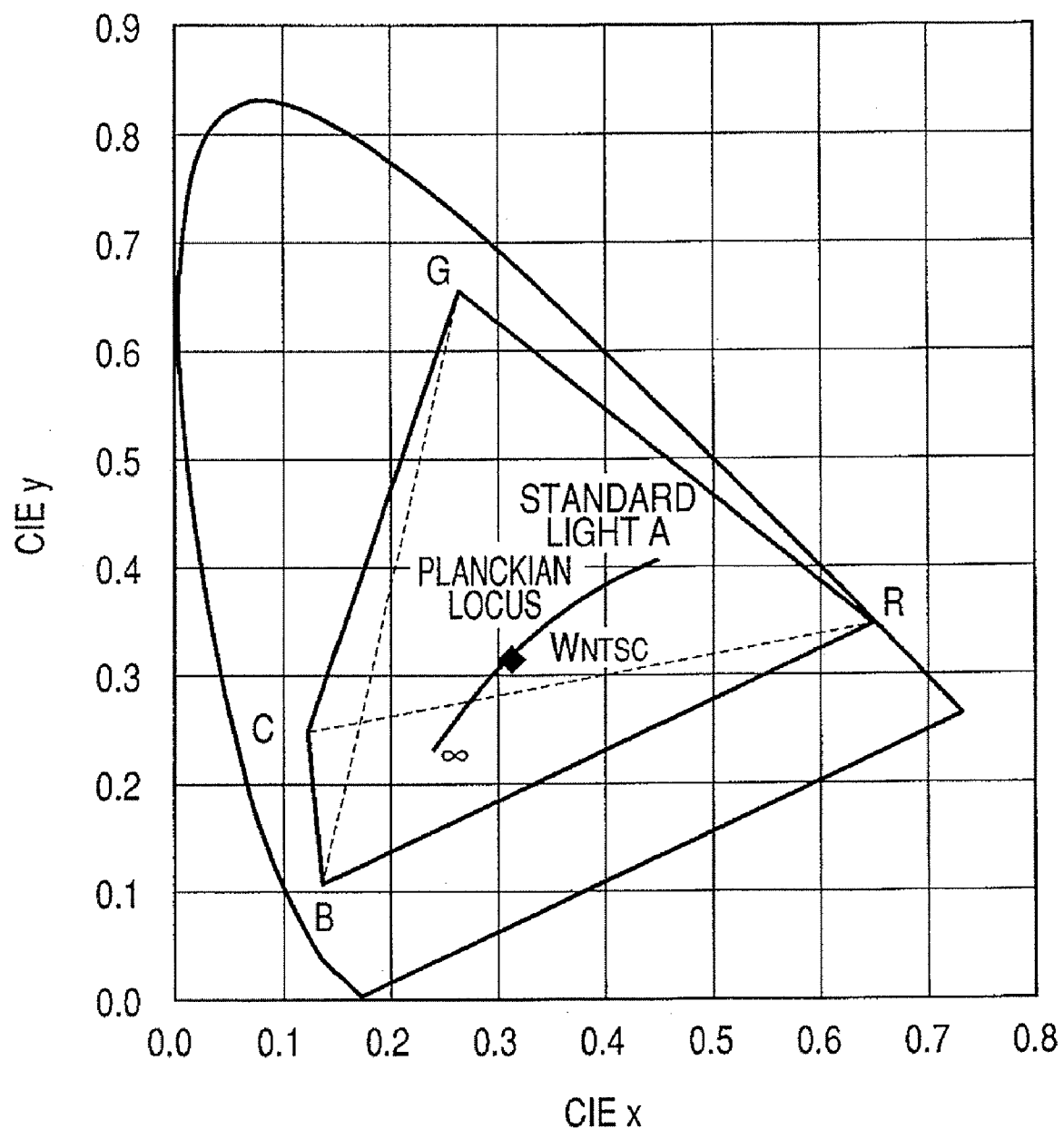
FIG. 3 is a view showing CIE chromaticity coordinates of RGBC.

It is understood from FIG. 3 that a color gamut of a rectangle RGCB is obtained by adding a C sub-pixel to a color gamut of a triangle RGB including RGB sub-pixels, and the color gamut can be expanded by the increase in the triangle GCB.

Further, the above-mentioned configuration is effective for reducing power consumption of the entire organic EL display apparatus. More specifically, as shown in FIG. 3, a rectangle RGCB that is a kind of a convex polygon is composed of RGBC sub-pixels. A solid line in the vicinity of the center positioned inside of the rectangle RGCB represents a substantially white region of a Planckian locus. The Planckian locus represents a change in chromaticity in a CIE coordinate system involved in a change in temperature of Planckian radiation. FIG. 3 shows a Planckian locus from a reddish white Planckian radiation (CIE standard light A) of 2856K to a bluish white Planckian radiation at an infinity temperature, which is a region to be substantially white. White $W_{NTSC}$ (0.31, 0.316) is positioned substantially at the center in the substantially white region of the Planckian locus. A broken line RC connecting R and C in FIG. 3 crosses the solid line of the substantially white region of the Planckian locus. Then, it is understood that the R sub-pixel and the C sub-pixel having a high light emitting efficiency, composed of a phosphorescent light emitting device, form a pair of sub-pixels having a relationship of complementary colors with white color interposed therebetween (cross point between the substantially white region of the Planckian locus and the broken line RC). This is defined as a pair of sub-pixels of complementary colors. The broken line RC is positioned in the vicinity of the white $W_{NTSC}$, so the luminance ratio between the R sub-pixel and the C sub-pixel having a high light emitting efficiency, constituting the pair of sub-pixels of complementary colors RC can be enhanced when the white $W_{NTSC}$ is displayed. Therefore, the power consumption of the entire organic EL display apparatus can be reduced remarkably. Specifically, the increase in a luminance ratio is assumed to mean that the ratio of the sum of luminance of sub-pixels of two colors to be complementary colors, with respect to the sum of luminance of all the sub-pixels, is 80% to 100%. As described later, compared with the power consumption evaluation value of the organic EL display apparatus including the conventional RGB 3 sub-pixels, the power consumption can be reduced by about 50%. When a white color is displayed, a color other than two colors to be complementary colors may be emitted so that the chromaticity of a white color is finely adjusted. At this time, the color other than two colors to be complementary colors is used for emitting light in an auxiliary manner, so the power consumption can be reduced even if the light emitting efficiency of the sub-pixel of the color other than the two colors to be complementary colors is relative low.

Figure 4:
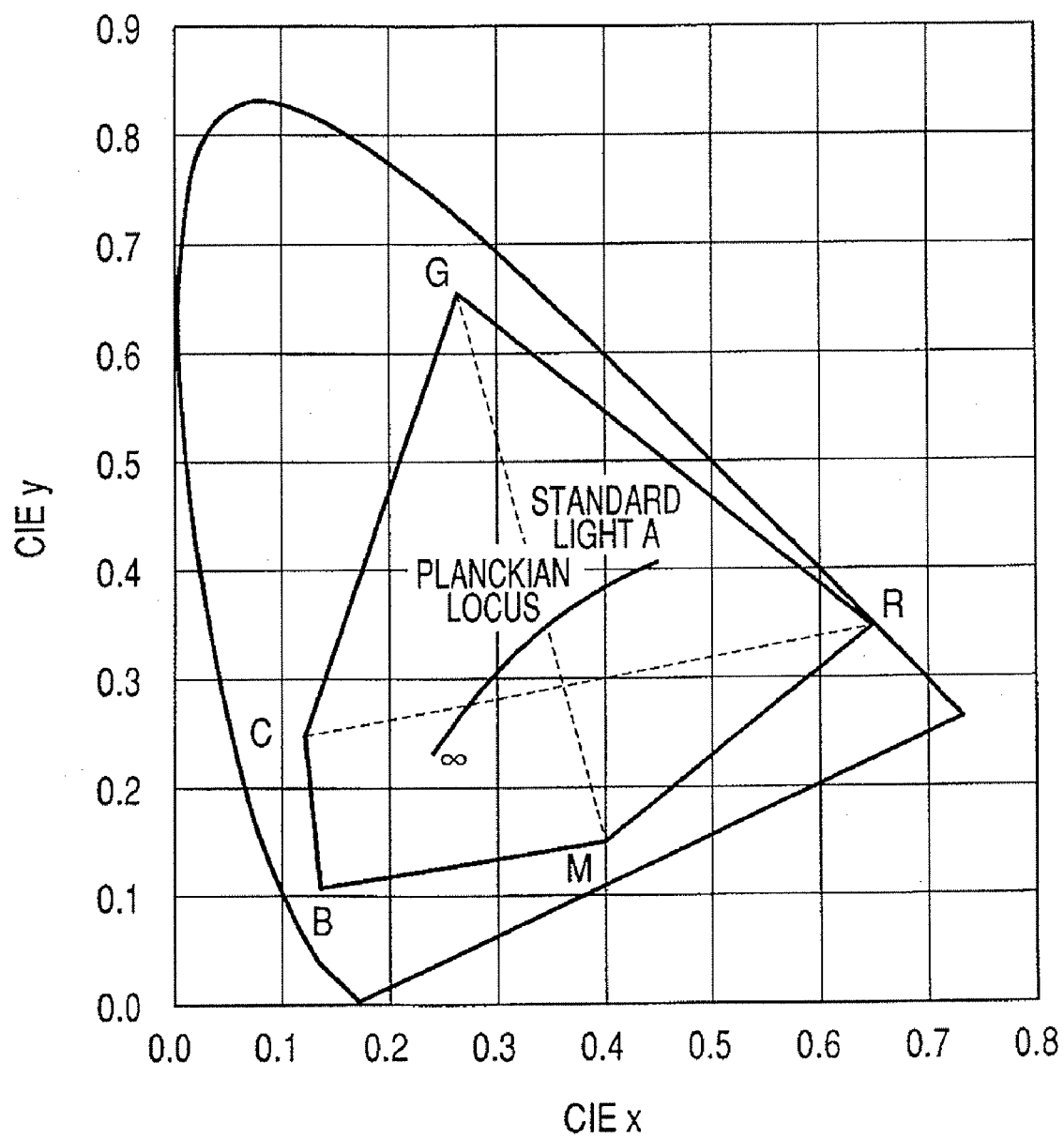
FIG. 4 is a view showing CIE chromaticity coordinates of RGBCM.

In the above-mentioned embodiment, one pixel includes four sub-pixels of RGCB, and the R sub-pixel and the C sub-pixel are phosphorescent light emitting devices. However, the present invention is not limited to such a combination of sub-pixels. FIG. 4 shows a color gamut in a CIE coordinate system in the case where one pixel includes five sub-pixels of RGBCM. A pair of sub-pixels RC and a pair of sub-pixels GM have a positional relationship of complementary colors with a substantially white region of the Planckian locus interposed. Thus, the pair of sub-pixels of complementary colors RC, the pair of sub-pixels of complementary colors GM, or both of the pairs of sub-pixels are composed of devices with a high light emitting efficiency, whereby the enlargement of a color gamut and the reduction in power consumption can be performed. This is also applied to the case where one pixel includes six pixels RGBCMY.

The present invention is effective to an organic EL device including sub-pixels of at least four colors on a convex polygon containing a white color on the CIE chromaticity coordinate system. Then, a pair of sub-pixels (pair of sub-pixels of complementary colors) having a relationship of complementary colors with a white color interposed are set to be organic EL devices with a high light emitting efficiency, whereby the effect of the present invention is exhibited.

The light emitting efficiency of the organic EL device is enhanced along with the increase in an external quantum efficiency. The external quantum efficiency is defined from an internal quantum efficiency and a light extraction efficiency by the following equation.

External quantum efficiency=Light extraction efficiency×Internal quantum efficiency Thus, in order to obtain a high light emitting efficiency, one of the internal quantum efficiency and the light extraction efficiency, or both of them may be increased. Since the internal quantum efficiency of fluorescent light emission is 25% or less, and the light extraction efficiency of the organic EL device is generally about 18% or more to 30% or less, so the external quantum efficiency of the ordinary fluorescent organic EL device is at most about 7.5%. Thus, the organic EL device with an external quantum efficiency larger than 7.5% can be used as the above-mentioned organic EL device with a high light emitting efficiency.

Figure 5:
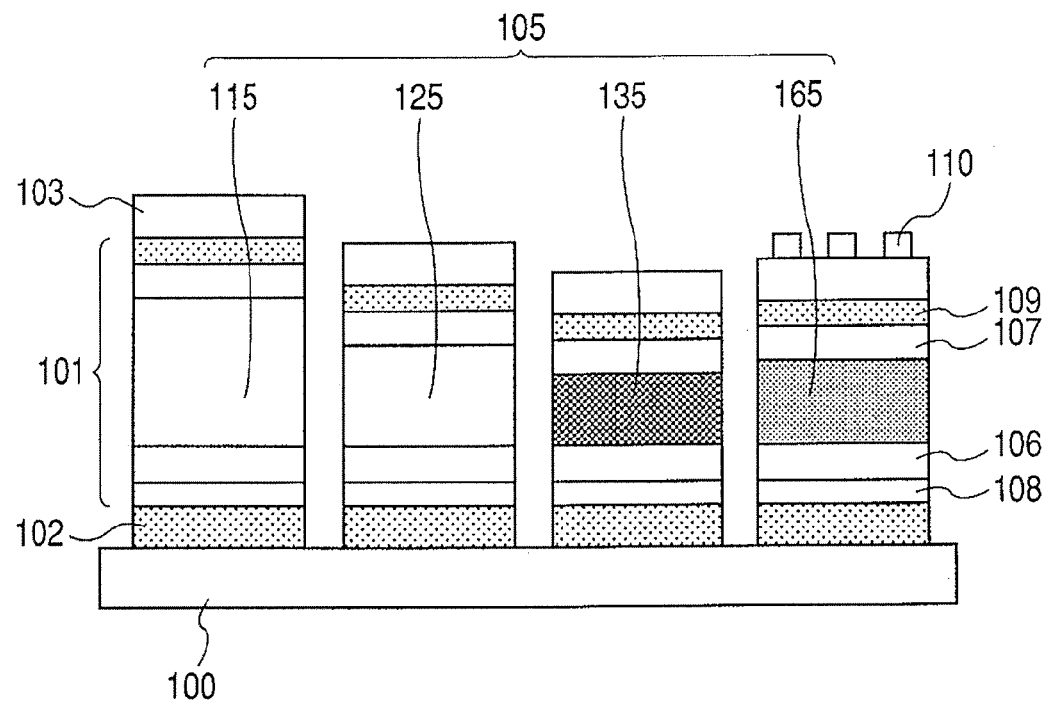
FIG. 5 is a schematic cross-sectional view showing an exemplary pixel configuration having a periodic structure in the organic EL display apparatus of the present invention.

One of measures for enhancing a light extraction efficiency is a microcavity structure. The microcavity structure refers to a structure in which a light emitting layer is inteposed by two reflective interfaces (for example, a reflective electrode and a metal semi-transparent electrode) and an optical path length between two reflective interfaces is adjusted such that a light from a light emitting layer is intensified by multiple interference. Another measure is one in which photonic crystal having period with arround light emitting wavelength is disposed at a light emitting device to suppress light confinement into the device by whole reflection, and light extraction efficiency is improved by a diffracted light. The photonic crystal structure refers to one in which materials having different dielectric constants are periodically disposed. FIG. 5 is a schematic cross-sectional view of an organic EL display apparatus in which, among four sub-pixels of RGBC, the R sub-pixel is a phosphorescent light emitting device, a two-dimensional photonic crystal structure is formed in a transparent electrode on a light extraction side of the C sub-pixel, and a pair of sub-pixels of complementary colors RC are devices with a high light emitting efficiency. The same reference numerals as those in FIG. 1 denote the same components as those therein. The period of the two-dimensional photonic crystal is desirably about λ/4 to λ, with the wavelength of light emitting color being λ.

The organic compounds used for the hole transporting layer 106, the light emitting layer 105, the electron transporting layer 107, the hole injecting layer 108, and the electron injecting layer 109 include one of a low-molecular material, a polymer material, and both of them, and they are not particularly limited. Further, an inorganic compound may be used if required.

Hereinafter, examples of those compounds are given.

A hole transporting material preferably has excellent mobility for facilitating injection of a hole from an anode and transporting the injected hole to the light emitting layer. Examples of the low-molecular material and the polymer material each having hole injecting or transporting property include, but of course not limited to, a triarylamine derivative, a phenylenediamine derivative, a triazole derivative, an oxadiazole derivative, an imidazole derivative, a pyrazoline derivative, a pyrazolone derivative, an oxazole derivative, a fluorenone derivative, a hydrazone derivative, a stilbene derivative, a phthalocyanine derivative, a porphyrin derivative, poly(vinylcarbazole), poly(silylene), poly(thiophene), and other conductive polymers. Hereinafter, a part of specific examples of the materials is shown.

Low-molecular hole injecting and transporting materials

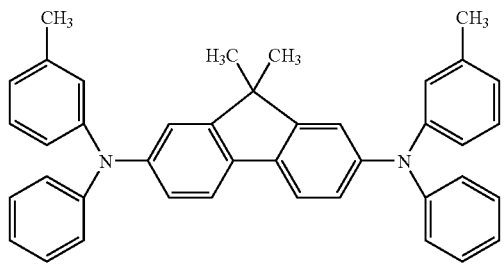

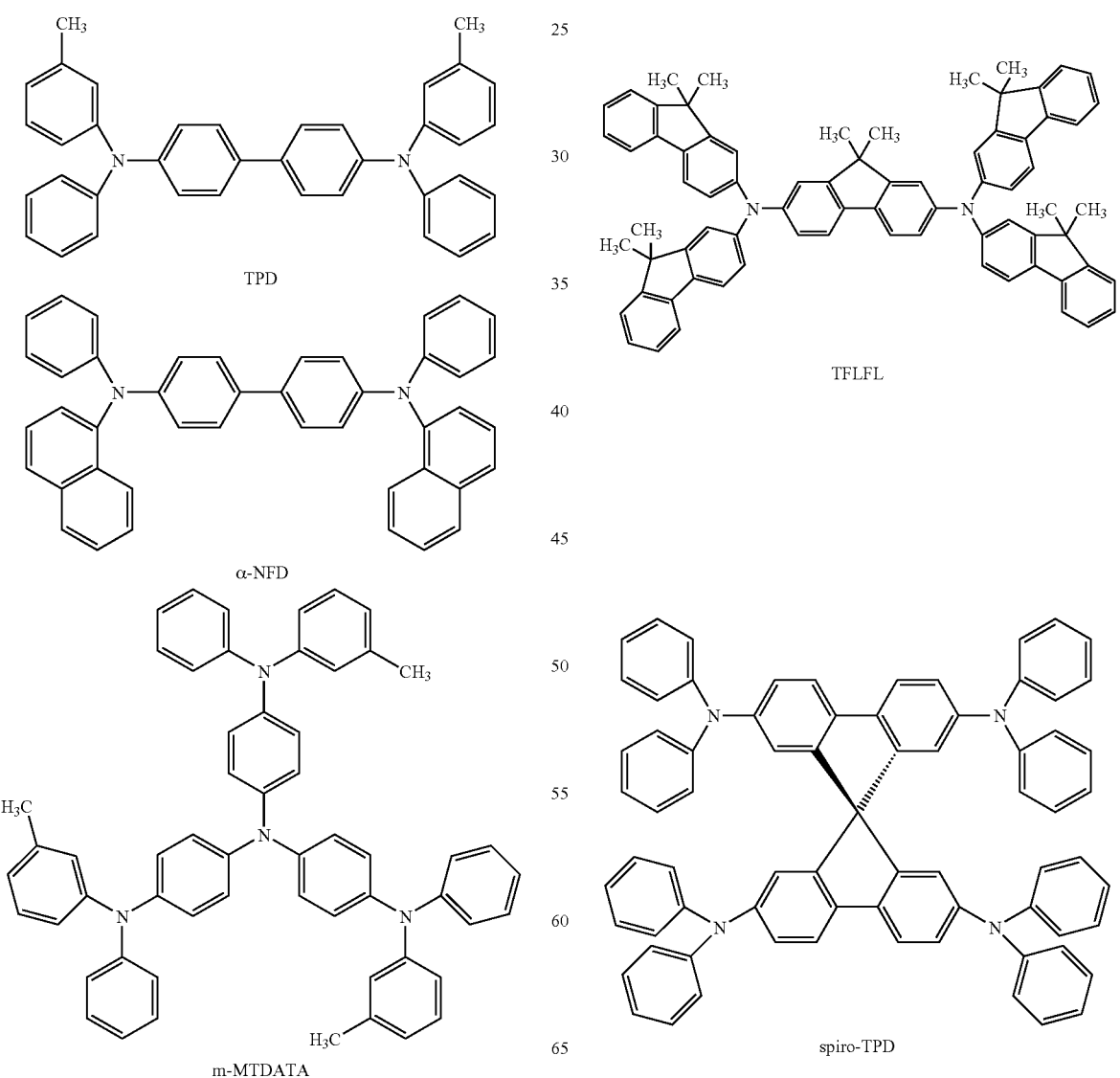

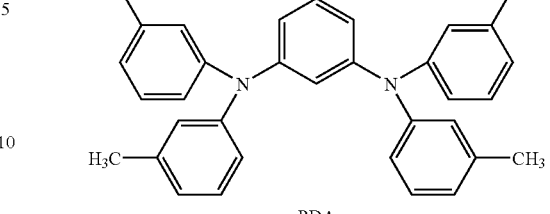
PDA
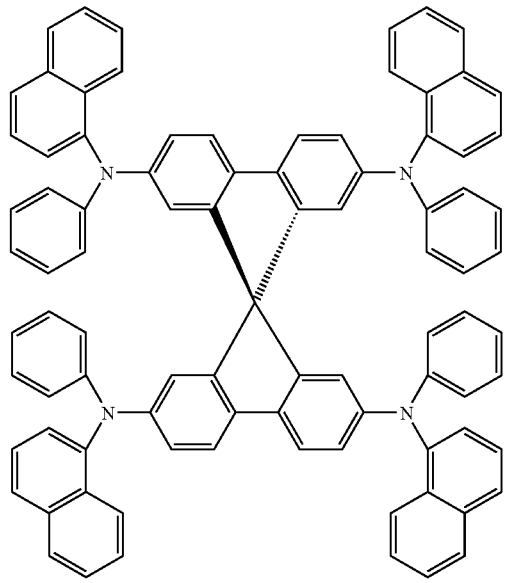
spiro-NPD
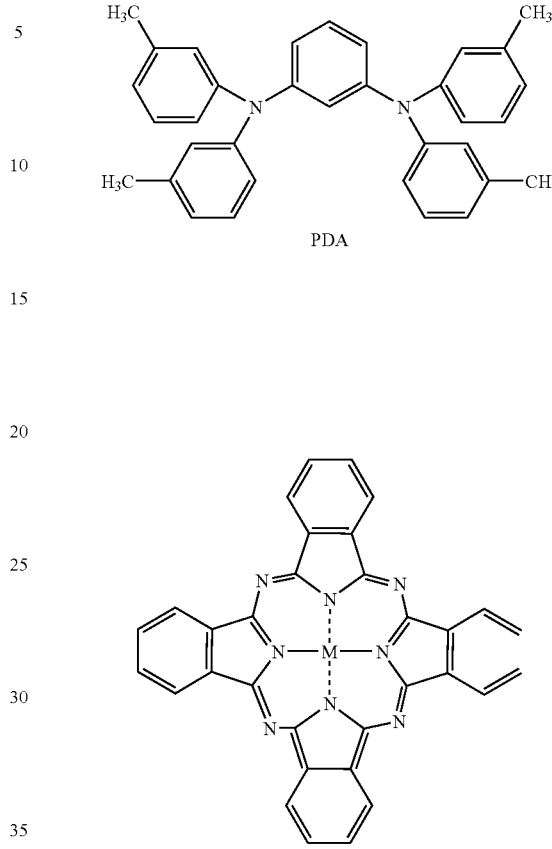
Pc-M
M: Cu Mg, AlCl, HO, SiCl₂, Zn, Sn, MnCl GaCl, etc
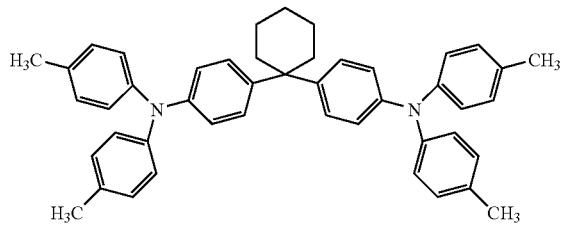
IPAC
Polymer Hole Transporting Materials
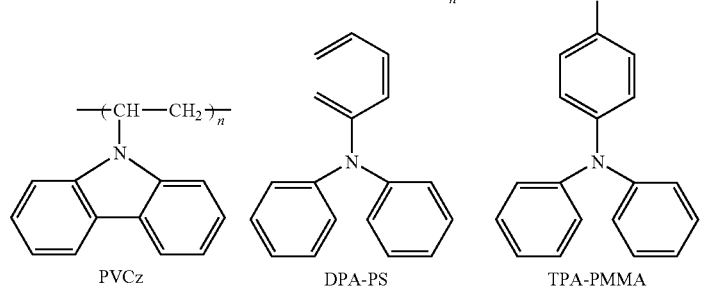
PVCz     DPA-PS     TPA-PMMA

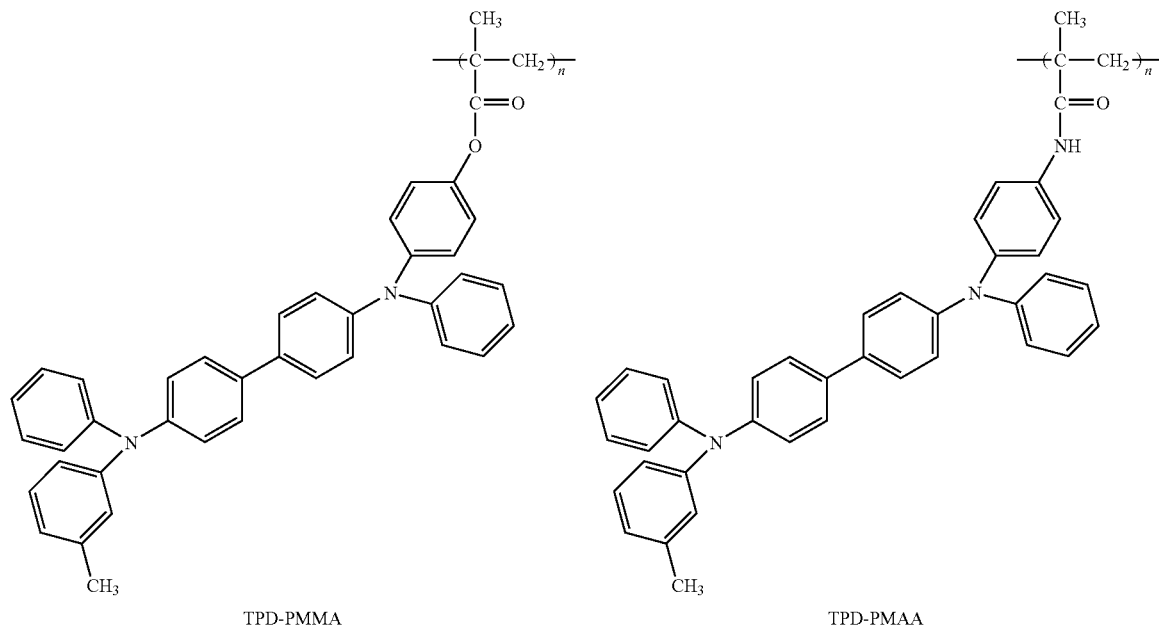
TPD-PMMA          TPD-PMAA
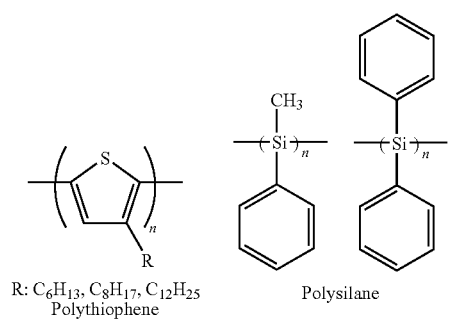
R: $C_6H_{13}$, $C_8H_{17}$, $C_{12}H_{25}$
Polythiophene     Polysilane
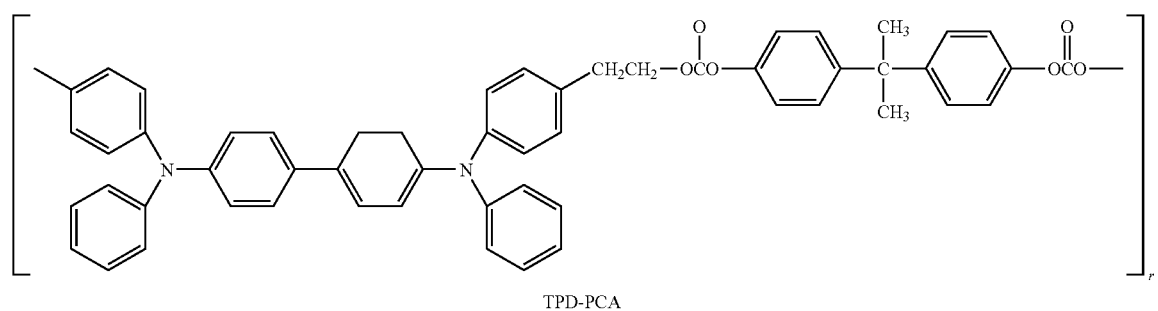
TPD-PCA
One of a fluorescent material and a phosphorescent material each having high light emitting efficiency is used as a light emitting material. Hereinafter, a part of specific examples of the material is shown.

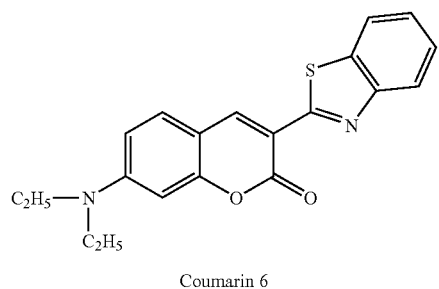

Coumarin 6

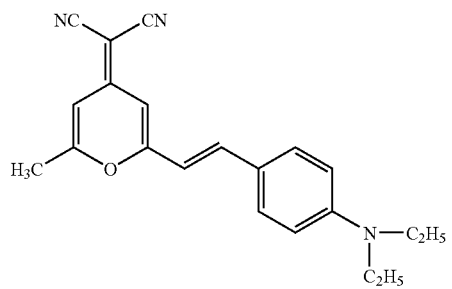

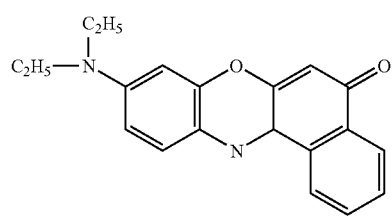

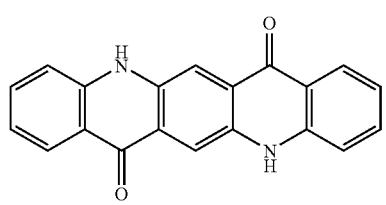

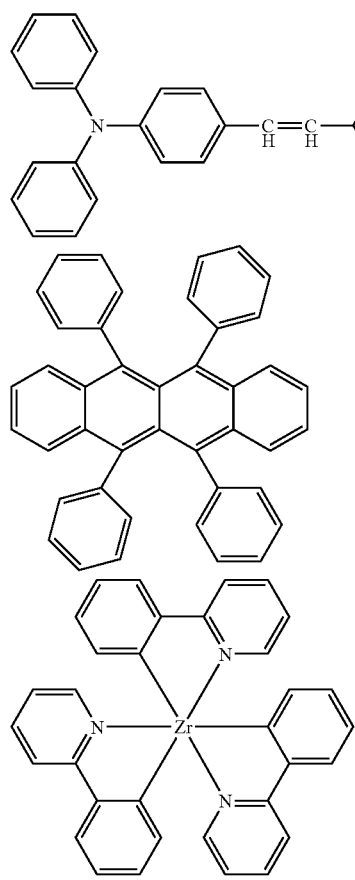

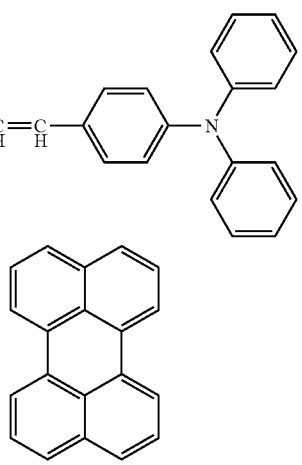

An electron transporting material can be arbitrarily selected from those each having a function of transporting an injected electron to the light emitting layer, and is selected in consideration of, for example, a balance with the carrier mobility of a hole transporting material. Examples of a material having electron injecting or transporting property include, but of course not limited to, an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, and an organometallic complex. Hereinafter, a part of specific examples of the material is shown.

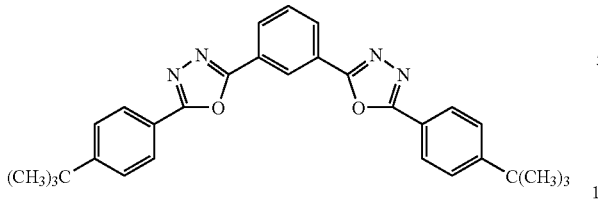

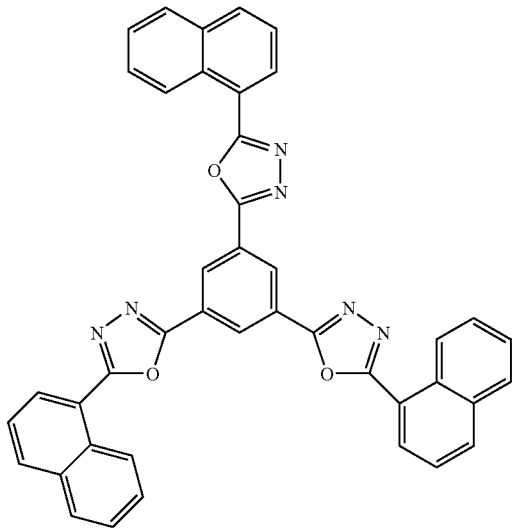

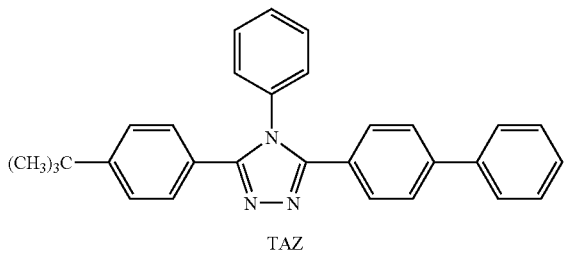

TAZ

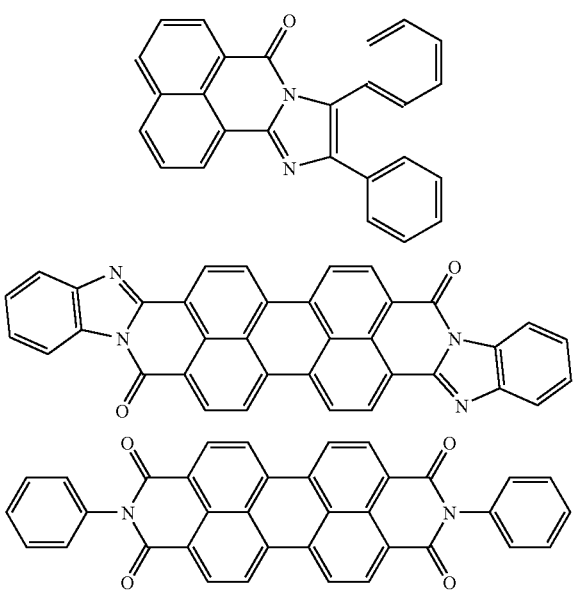

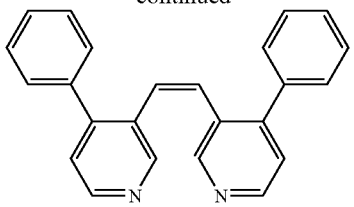

Bphen

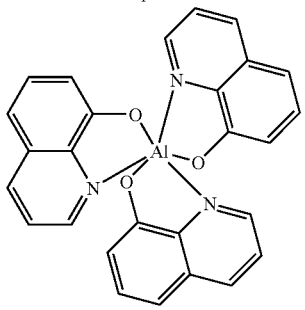

Alq

Examples of the hole injecting material include oxides of transition metal such as $MoO_3$, $WO_3$, and $V_2O_5$, and copper phthalocyanine.

In addition, examples of the electron injecting material include an alkali metal, an alkali earth metal, and a compound of such metal, and electron injecting property can be imparted to the above-mentioned electron transporting material by incorporating 0.1 percent or more and several tens of percent or less of the electron injecting material into the electron transporting material. Although the electron injecting layer 109 is not an indispensable layer, the electron injecting layer 109 having a thickness of about 10 nm or more to 100 nm or less is preferably inserted for securing satisfactory electron-injecting property in consideration of damage to be received later at the time of film formation upon subsequent formation of the transparent cathode 102.

The organic layer 101 can be generally formed by, for example, any one of a vacuum deposition method, an ionized vapor deposition method, sputtering, and plasma. Alternatively, the organic layer can be formed by: dissolving an organic compound into an appropriate solvent; and applying the solution by a known application method (such as spin coating, dipping, a cast method, an LB method, or an ink-jet method). In particular, when a film is formed by an application method, the film can be formed in combination with an appropriate binder resin. The above-mentioned binder resin can be selected from a wide variety of binding resins, and examples of the binder resin include, but not limited to, a polyvinyl carbazole resin, a polycarbonate resin, a polyester resin, a polyallylate resin, a polystyrene resin, an ABS resin, a polybutadiene resin, a polyurethane resin, an acrylic resin, a methacrylic resin, a butyral resin, a polyvinyl acetal resin, a polyamide resin, a polyimide resin, a polyethylene resin, a polyether sulfone resin, a diallyl phthalate resin, a phenol resin, an epoxy resin, a silicon resin, a polysulfone resin, and a urea resin. One kind of those resins may be used alone to function as a polymer, or two or more kinds thereof may be mixed to function as a copolymer. Further, a known additive such as a plasticizer, an antioxidant, or a UV absorber may be used in combination as required.

An oxide conductive film made of ITO or IZO can be used as the transparent electrode 102. A combination of the electron transporting layer 107 and the electron injecting layer 109 is desirably selected in such an appropriate manner that satisfactory electron injecting property can be obtained. In addition, the transparent electrode can be formed by sputtering.

In some cases, a protective layer is provided for preventing contact with oxygen or moisture. Examples of the protective layer include: a metal nitride film such as silicon nitride and silicon nitride oxide; a metal oxide film such as tantalum oxide; a diamond thin film; a polymer film such as a fluorine resin, polyparaxylene, polyethylene, a silicone resin and a polystyrene resin; and a photocurable resin. Alternatively, a device itself may be covered with glass, a gas impermeable film or a metal, and packaged in an appropriate sealing resin. In addition, a hygroscopic material may be incorporated into the protective layer for improving moisture resistance.

Hitherto, the configuration in which a substrate side is an anode has been described. However, the present invention can be carried out even with a stack configuration in which a substrate side is a cathode, and is not particularly limited.

Further, the present invention can be carried out even with a bottom emission device obtained by: forming a transparent electrode on a transparent substrate; and stacking an organic layer and a reflective electrode on the resultant.

Further, the present invention can also be carried out even with a tandem device or stacked OLED device in which a plurality of organic EL devices are stacked.

Figure 6:
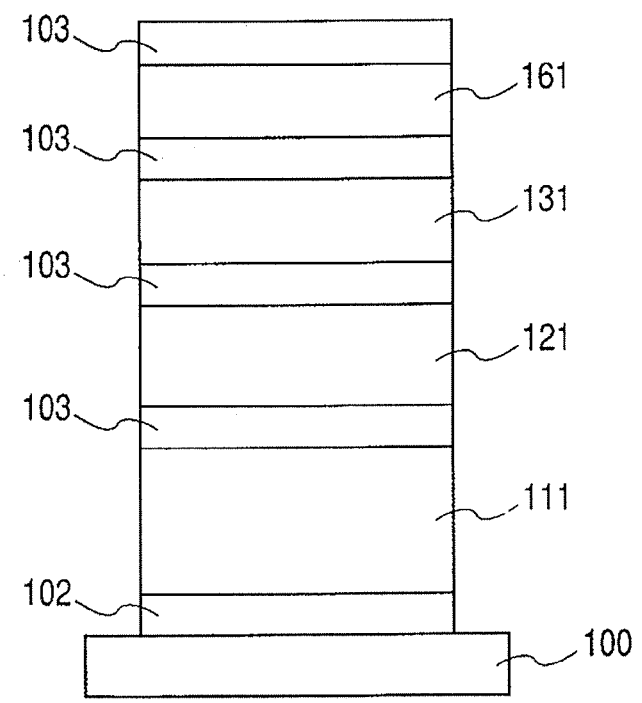
FIG. 6 is a schematic cross-sectional view showing an exemplary pixel configuration in which sub-pixels are stacked in the organic EL display apparatus of the present invention.
Figure 7:
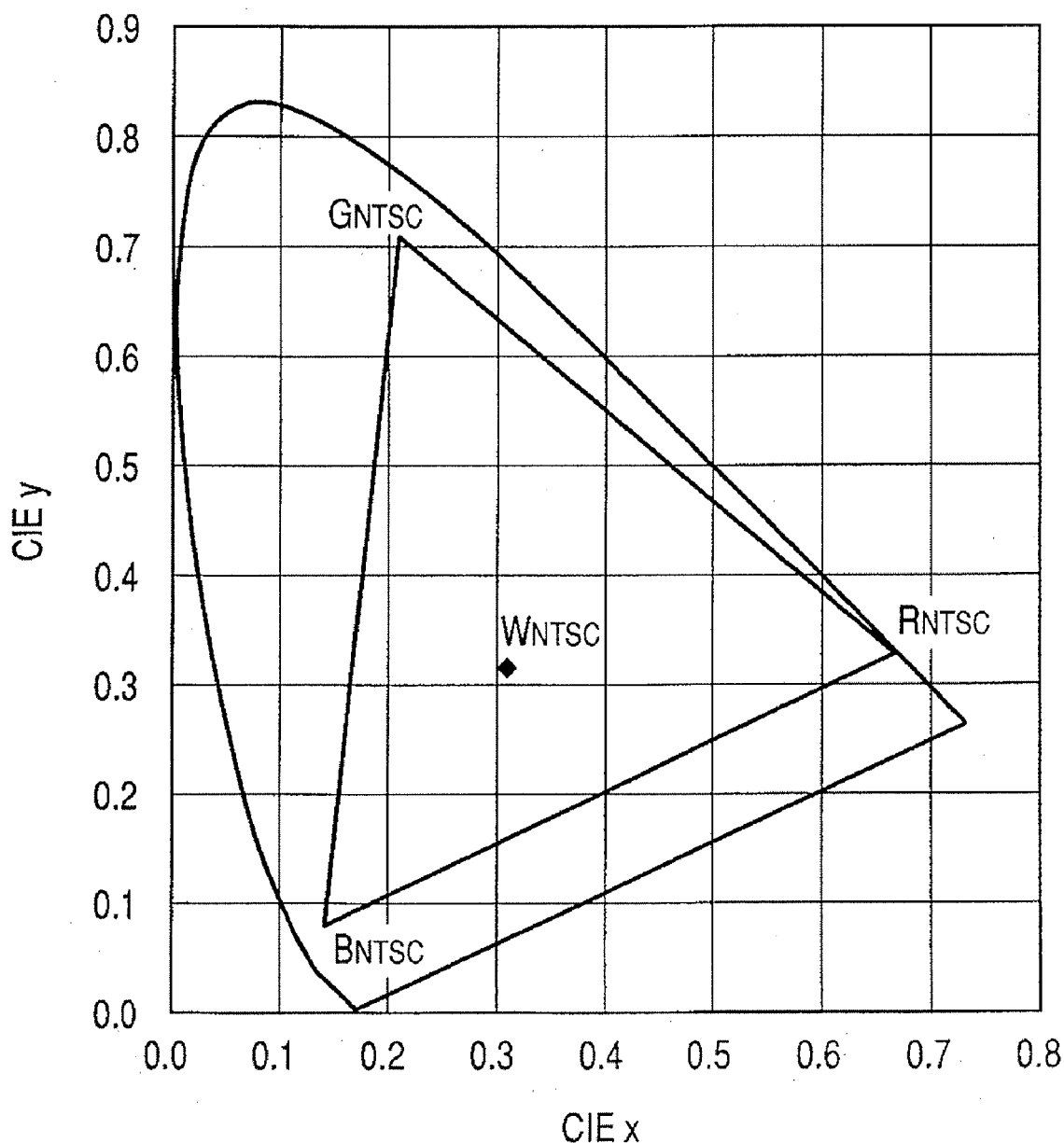
FIG. 7 is a diagram showing a chromaticity of 100% of the NTSC system on the CIE chromaticity coordinates.

FIG. 6 is a schematic view (schematic cross-sectional view) of a stacked four sub-pixel configuration of RGBC. In FIG. 6, the configuration is the same as that in FIG. 1, except that sub-pixels of RGBC constituting a pixel are stacked in a direction perpendicular to a substrate, and the same reference numerals as those in FIG. 1 denote the same components as those therein. The apparatus shown in FIG. 6 can be obtained by forming the reflective electrode 102, successively stacking the R organic layer 111, the transparent electrode 103, the G organic layer 121, the transparent electrode 103, the B organic layer 131, the transparent electrode 103, the C organic layer 161, and the transparent electrode 103, and forming a protective layer.

Hereinafter, although the present invention will be described by way of examples, the present invention is not limited thereto.

Example 1

A full-color organic EL display apparatus having pixels (in the present example, a hole injecting layer is not formed) in a configuration as shown in FIG. 1 is produced by the following method.

First, a TFT drive circuit including low-temperature polysilicon is formed on a glass substrate as a support member. A planarization layer including an acrylic resin is formed on the resultant, whereby a substrate 100 is obtained. An Ag alloy (AgPdCu) having a thickness of about 100 nm to serve as a reflective metal is formed on the resultant by a sputtering method, followed by patterning. Further, IZO having a thickness of 20 nm to serve as a transparent conductive film is formed by a sputtering method, followed by patterning. Thus, a reflective electrode 102 is formed. Further, a device separating film is formed of an acrylic resin, whereby the substrate with an anode formed thereon is produced. The resultant is subjected to ultrasonic washing with isopropyl alcohol (IPA), and is then subjected to boiling washing before being dried.

After that, the resultant is subjected to UV/ozone washing, and then an organic compound is formed into a film by vacuum vapor deposition.

On the stack thus obtained, a hole transporting layer 106 is formed of a compound (I) represented by the following structural formula. Using a shadow mask, 50 nm of an R hole transporting layer, 30 nm of a G hole transporting layer, 20 nm of a B hole transporting layer, and 25 nm of a C hole transporting layer are formed on each sub-pixel. The vacuum degree at this time is $1 \times 10^{-4}$ Pa and a vapor deposition rate is 0.2 nm/sec.

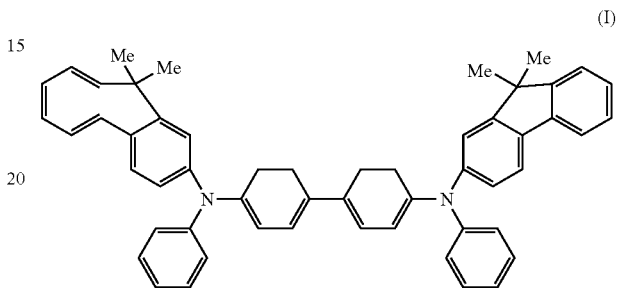

(I)

Next, as light emitting layers, each light emitting layer of RGBC is formed using a shadow mask. As an R light emitting layer 115, CBP as a host and a phosphorescent compound BtpIr(acac) are co-deposited from the vapor to provide a light emitting layer of 60 nm. As a G light emitting layer 125, Alq3 as a host and a light emitting compound coumarin 6 are co-deposited from the vapor to provide a light emitting layer of 40 nm. As a B light emitting layer 135, a compound (II) as a host and a light emitting compound (III) represented by the following structural formulae are co-deposited from the vapor to provide a light emitting layer of 20 nm. As a C light emitting layer 165, CBP as a host and a phosphorescent compound Firpic are co-deposited from the vapor to provide a light emitting layer of 25 nm.

Film formation is performed under the conditions upon vapor deposition including vacuum degree of $1 \times 10^{-4}$ Pa and a film formation rate of 0.2 nm/sec.

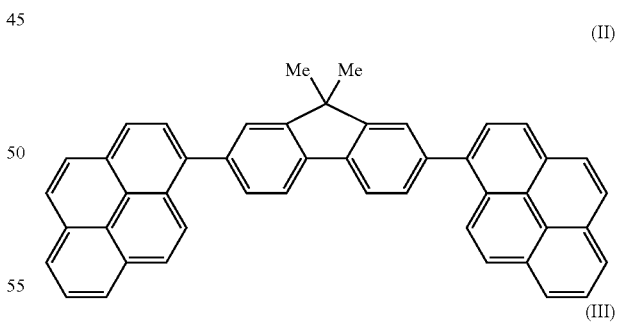

(II)

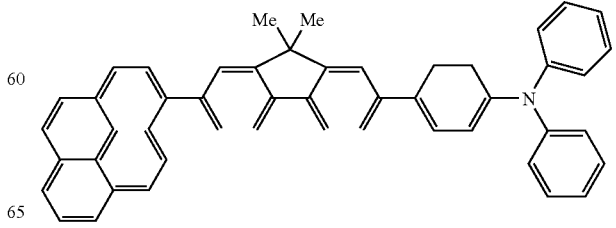

(III)

Further, bathophenanthroline (Bphen) is formed into a film having a thickness of 10 nm to serve as the common electron transporting layer 107 by a vacuum vapor deposition method. The vapor deposition is performed under the conditions including a vacuum degree of $1\times10^{-4}$ Pa and a film formation rate of 0.2 nm/sec. Next, Bphen and $Cs_2CO_3$ are co-deposited from the vapor (at a weight ratio of 90:10) and formed into a film having a thickness of 20 nm to serve as the common electron injecting layer 109. The vapor deposition is performed under the conditions including a vacuum degree of $3\times10^{-4}$ Pa and a film formation rate of 0.2 nm/sec.

The substrate with the layers up to the electron injecting layer 109 formed thereon is moved to a sputtering apparatus under vacuum, and ITO is formed into a film of a thickness of 60 nm as a transparent cathode 103. Further, as a protective film, silicon nitride oxide is formed into a film of a thickness of 700 nm, whereby an organic EL display apparatus is obtained.

With the organic EL display apparatus, the power consumption for displaying white color $W_{NTSC}$ (0.31, 0.316) at 100 cd/m$^2$ is determined (aperture ratio: 50%, driving voltage: 10 V). Table 2 shows the results. The sum of the luminance ratios of the R sub-pixel and the C sub-pixel including phosphorescent light emitting devices is 83.2%.

TABLE 2

| SUB-PIXEL | CIEx | CIEy | LIGHT EMITTING EFFICIENCY [cd/A] | @100 cd/m$^2$, W(0.31, 0.16) | |
|---|---|---|---|---|---|
| | | | | LUMI-NANCE RATIO | POWER CONSUMPTION [mW] |
| R | 0.651 | 0.349 | 21.6 | 36.8% | 144 |
| G | 0.260 | 0.658 | 19.8 | 16.8% | |
| B | 0.137 | 0.110 | 2.3 | 0% | |
| C | 0.123 | 0.250 | 16.4 | 46.4% | |

For comparison, Table 3 shows the power consumption of an organic EL display apparatus produced in the same way except that a C pixel is not formed.

TABLE 3

| SUB-PIXEL | CIEx | CIEy | LIGHT EMITTING EFFICIENCY [cd/A] | @100 cd/m$^2$, W(0.31, 0.16) | |
|---|---|---|---|---|---|
| | | | | LUMI-NANCE RATIO | POWER CONSUMPTION [mW] |
| R | 0.651 | 0.349 | 21.6 | 30.4% | 300 |
| G | 0.260 | 0.658 | 19.8 | 53.3% | |
| B | 0.137 | 0.110 | 2.3 | 16.3% | |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2006-103937, filed Apr. 5, 2006 and No. 2007-068822, Mar. 16, 2007, which are hereby incorporated by reference herein in their entirety.

What is claimed is:

1. An organic electroluminescent display apparatus, comprising a plurality of pixels which constitute a display portion, wherein:

each of the pixels includes a plurality of sub-pixels each of the sub-pixels including an organic electroluminescent device having a pair of electrodes and an organic compound layer formed between the pair of the electrodes;

the plurality of sub-pixels comprise a first sub-pixel which emits a blue color, a second sub-pixel which emits a green color, a third sub-pixel which emits a red color, and a fourth sub-pixel which emits a cyan or magenta color;

a light-emitting compound in each of the organic compound layers is only one of a fluorescent organic compound and a phosphorescent organic compound; and the light-emitting compound in the organic compound layer of the first sub-pixel which emits a blue color is a fluorescent organic compound, and the light-emitting compound in the organic compound layer of the fourth sub-pixel which emits a cyan or magenta color is a cyan phosphorescent organic compound or a magenta phosphorescent compound.

2. The organic electroluminescent display apparatus according to claim 1, wherein, when a white color is displayed, a ratio of a sum of luminance of the fourth sub-pixel having the cyan phosphorescent organic compound and the third sub-pixel which emits a red color, or a ratio of a sum of luminance of the fourth sub-pixel having the magenta phosphorescent organic compound and the second sub-pixel which emits a green color, with respect to a sum of luminance of the sub-pixels is 80% or more to 100% or less.

3. The organic electroluminescent display apparatus according to claim 1, wherein chromaticity coordinates of the white color are any one point coordinates contained in a Planckian locus where a color temperature is from a point of 2856K to an infinity point in a CIE chromaticity diagram.

4. The organic electroluminescent display apparatus according to claim 1, wherein at least one of the fourth sub-pixel having the cyan phosphorescent organic compound and the third sub-pixel which emits a red color, or at least one of the fourth sub-pixel having the magenta phosphorescent organic compound and the second sub-pixel which emits a green color has a light extraction efficiency of larger than 30%.

5. The organic electroluminescent display apparatus according to claim 1, wherein at least one of the fourth sub-pixel having the cyan phosphorescent organic compound and the third sub-pixel which emits a red color, or at least one of the fourth sub-pixel having the magenta phosphorescent organic compound and the second sub-pixel which emits a green color includes any one of a diffraction grating, a photonic crystal, a periodic structure, and a combination thereof.

6. The organic electroluminescent display apparatus according to claim 1, wherein each of the pixels comprise the plurality of sub-pixels being stacked.

7. A method of displaying an image of the organic electroluminescent display apparatus according to claim 1, comprising lighting the fourth sub-pixel having the cyan phosphorescent organic compound and the third sub-pixel which emits a red color, or the fourth sub-pixel having the magenta phosphorescent organic compound and the second sub-pixel which emits a green color to display a white color.

8. The organic electroluminescent display apparatus according to claim 1, which comprises the fourth sub-pixel which emits the cyan color, wherein the third sub-pixel which emits a red color a is phosphorescent organic compound.

* * * * *